United States Patent
Cave et al.

(10) Patent No.: US 6,924,184 B2
(45) Date of Patent: Aug. 2, 2005

(54) SEMICONDUCTOR DEVICE AND METHOD FOR FORMING A SEMICONDUCTOR DEVICE USING POST GATE STACK PLANARIZATION

(75) Inventors: Nigel G. Cave, Austin, TX (US); Anna M. Phillips, Manchaca, TX (US); Terry G. Sparks, Montbonnot St. Martin (FR)

(73) Assignee: Freescale Semiconductor, Inc., Austin, TX (US)

( * ) Notice: Subject to any disclaimer, the term of this patent is extended or adjusted under 35 U.S.C. 154(b) by 68 days.

(21) Appl. No.: 10/394,352

(22) Filed: Mar. 21, 2003

(65) Prior Publication Data

US 2004/0183204 A1 Sep. 23, 2004

(51) Int. Cl.$^7$ .............................................. H01L 21/8238
(52) U.S. Cl. ........................................ 438/201; 438/211
(58) Field of Search ................................ 438/151, 201, 438/211, 216, 230, 265

(56) References Cited

U.S. PATENT DOCUMENTS

| 4,755,478 | A | * | 7/1988 | Abernathey et al. ........ 438/296 |
| 5,022,958 | A | * | 6/1991 | Favreau et al. ............. 438/297 |
| 5,268,330 | A | * | 12/1993 | Givens et al. .............. 438/586 |
| 5,665,202 | A |   | 9/1997 | Subramanian et al. |
| 6,423,619 | B1 |   | 7/2002 | Grant et al. |
| 6,448,163 | B1 | * | 9/2002 | Holbrook et al. ........... 438/585 |
| 6,524,920 | B1 | * | 2/2003 | Yu ............................ 438/303 |

* cited by examiner

*Primary Examiner*—S. V. Clark
(74) *Attorney, Agent, or Firm*—Joanna G. Chiu; James L. Clingan, Jr.

(57) ABSTRACT

Via holes to the source/drains of a transistor are made to have very uniform depths so that photoresist thickness can be minimized to reduce the problems associated with small hole vias and vias that are at minimum pitches. This is achieved by polishing a dielectric over the gate stack to a polish stop present over the gate stack to result in having a top surface that is coplanar with the top surface of the polish stop layer over the gate stack. This establishes a top surface that is very uniform in height above the substrate across the wafer. A subsequent dielectric formed on this top surface is thus also very uniform in height over the wafer. The photoresist thickness then can be selected to the least thickness necessary based upon the expectation of maintaining a pattern for etching through a layer of very uniform thickness.

24 Claims, 4 Drawing Sheets

SEMICONDUCTOR DEVICE AND METHOD FOR FORMING A SEMICONDUCTOR DEVICE USING POST GATE STACK PLANARIZATION

FIELD OF THE INVENTION

The present invention relates generally to semiconductor processing and more specifically, to semiconductor processing using post gate stack planarization.

RELATED ART

Currently, in semiconductor processing, various different types of devices are formed by forming gate stacks on a surface of a semiconductor substrate. After formation of the isolation regions and gate stacks, an interlevel dielectric (ILD) layer is generally formed over the gate stack to electrically isolate the gate stacks from the device contacts, surrounding devices, and subsequent layers. Currently, the ILD layer is deposited over the gate stacks and then subsequently planarized such that a minimum thickness of the ILD layer remains over the tops of the gate stacks. This minimum thickness is of the order of 1000 to 1500 Angstroms in order to prevent gate stack erosion due to chemical mechanical polishing (CMP) process margin considerations. Furthermore, this minimum thickness increases the overall thickness required between the gate stack and any subsequent layer.

As the overall thickness between the gate stack and a subsequent layer increases, higher aspect ratio contacts are required for making electrical connections to the source/drain regions and gates of the devices. With increased overall thickness, a thicker layer of photo resist is required to effectively etch the openings through the ILD layer for forming the contacts. However, the thickness of the photo resist is limited by photo patterning considerations as well as the etch requirements, as known to one skilled in the art. That is, as devices decrease in size, the contacts themselves become narrower as does the spacing between contacts, thus the photo resist patterning must allow for the narrower openings, placing additional constraints on resist thickness. One problem in the current process is that during etch to form the openings for the contacts, the photo resist is overly eroded, thus removing portions of the underlying layers required for proper isolation of the resulting contacts. Other considerations relating to the overall thickness include the optimization of the capacitance between the gate stack and the subsequent metal layers. Therefore, a need exists for an improved integration process for forming a semiconductor device which addresses these considerations.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Embodiments of the invention described herein relate to the post gate stack planarization of the overlying dielectric layer. That is, by using a first dielectric layer as a polish stop for a second dielectric layer during CMP, improved planarization may be achieved. Furthermore, the improved planarization allows for improved flexibility in processing and thus allows for improved contact formation and improved metal to gate capacitance.

Note that as used herein, a low K dielectric refers to a dielectric having a dielectric constant less than that of silicon oxide, and a high K dielectric refers to a dielectric having a dielectric constant of greater than 10, commonly used as a gate dielectric.

Figure 1:
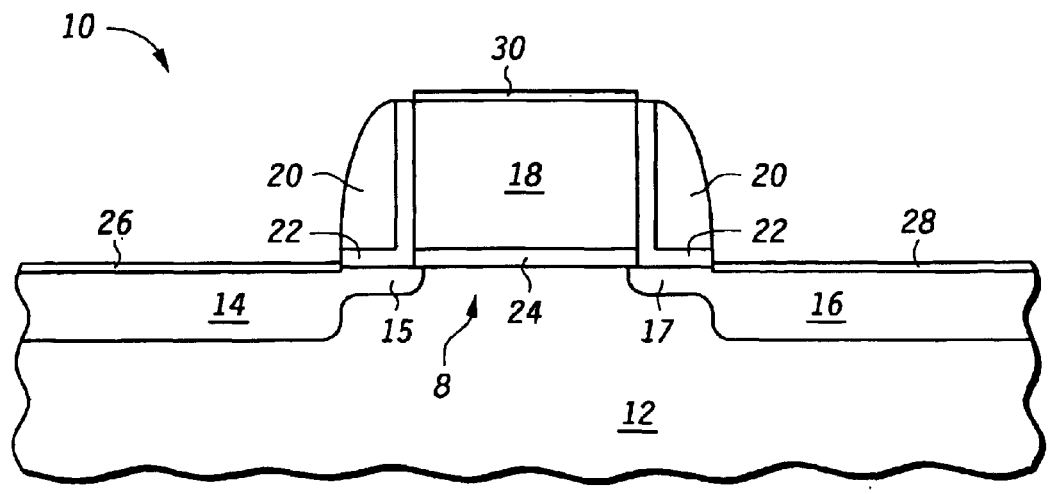
FIG. 1 illustrates a cross sectional view of a gate stack in accordance with one embodiment of the present invention.

FIG. 1 illustrates a semiconductor device 10 after formation of gate stack 8 and source/drain regions 14 and 16, in accordance with one embodiment of the present invention. Semiconductor device 10 includes a substrate 12 and a gate stack 8 formed over substrate 12. Semiconductor substrate 12 can be any type of substrate, such as, for example, a silicon substrate, silicon-on-insulator (SOI) substrate, a gallium arsenide substrate, or the like. It is assumed that trench isolation and well implants have been formed as required as known to one skilled in the art. Gate stack 8 includes a gate oxide 24 overlying substrate 12, and a gate 18 overlying gate oxide 24. Gate stack 8 also includes spacer liners 22 and spacers 20 on either side of gate 18 and gate oxide 24. Spacer liners 22 are formed along the sides of gate oxide 24 and gate 18 and overlying portions of substrate 12. Spacers 20 are formed overlying spacer liners 22 along the sides of gate oxide 24 and gate 18. Note that gate stack 8 can be any type of gate stack. For example, gate 18 may be a polysilicon gate, metal gate, non-volatile memory (NVM) dual gate, or any other type of gate used in semiconductor processing. Gate oxide 24 can be any type of gate oxide, such as, for example, silicon oxide-based gate dielectric, nitrided gate dielectric, or high-K gate dielectric. Spacer liners 22 can be formed of any type of dielectric, such as, for example, silicon oxide, and spacers 20 can be formed of any type of material, such as, for example, silicon nitride. Note also that in alternate embodiments, different materials or stacks of materials may be used to form spacer liners 22 and spacers 20. Note also that disposable spacer integration or dual/triple spacer integrations may be used. Also, note in alternate embodiments, gate stack 8 can be formed in a variety of different ways having more or less elements than those illustrated in FIG. 1. Therefore, FIG. 1 illustrates a typical gate stack but the embodiments described herein are not limited to a particular type of gate stack.

Source/drain regions 14 and 16 are formed on either side of gate stack 8 which form a channel region in substrate 12 between source/drain regions 14 and 16 and underlying gate oxide 24. In one embodiment, source/drain regions 14 and 16 are formed by implanting dopant species to form an N-type and a P-type region, as required. Also, note that in one embodiment, extension portions 15 and 17 of source/drain regions 14 and 16 are implanted prior to the formation of spacers 20 and spacer liners 22 (using gate 18 as an implanting mask) while the remaining portions of source/drain regions 15 and 16 are implanted after formation of spacers 20 and spacer liners 22 (using gate 18, spacers 20, and spacer liners 22 as an implanting mask). Note that formation of source/drain regions 14 and 16 may be formed using conventional processes as known in the art. Note also that the thickness (or height) of gate stack 8 is generally chosen so as to prevent penetration of the channel region underlying gate oxide 24 by the source/drain implant steps used to create source/drain regions 14 and 16.

Semiconductor device 10 also includes salicided regions 26, 28, and 30, where salicided region 26 is formed over source/drain region 14, salicided region 28 is formed over source/drain region 16, and salicided region 30 is formed over gate 18. The salicided regions are formed as known in the art, and may be formed of a metal, such as, for example, cobalt, nickel, titanium, or the like.

Figure 2:
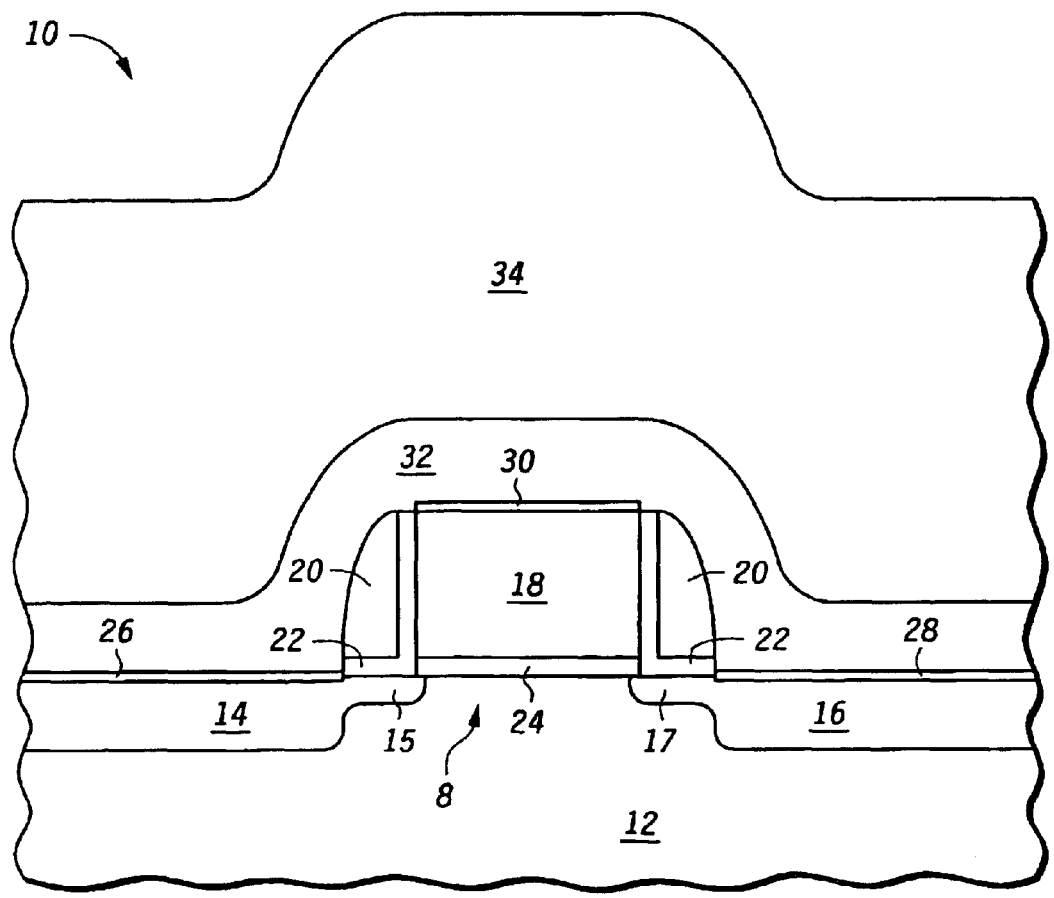
FIG. 2 illustrates a cross sectional view of the gate stack of FIG. 1 after formation of first and second dielectric layers overlying the gate stack in accordance with one embodiment of the present invention.

FIG. 2 illustrates semiconductor device 10 after formation of a first dielectric layer 32 overlying gate stack 8 and salicided regions 26, 28, and 30 and a second dielectric layer 34 overlying dielectric layer 32. In one embodiment, first dielectric layer 32 is a nitride layer and second dielectric layer 34 is a phosphorous doped silicon glass. However, in alternate embodiments, first dielectric layer 32 may be any low-K material such as, for example, carbon doped silicon oxide. Also, in alternate embodiments, second dielectric layer 34 may be any low-K material such as an oxide, a carbon doped silicon oxide, xerogel, aerogel, or the like. The materials for layers 32 and 34 are typically chosen depending on the desired CMP selectivity needed to CMP polish dielectric layer 34 while stopping on dielectric layer 32, as well as on the desired etch selectivity needed to etch dielectric layer 34 while stopping on dielectric layer 32, as will be described in more detail below. In one embodiment, first dielectric layer 32 has a thickness of at most 1000 Angstroms, or more preferably, has a thickness of 200 to 500 Angstroms. In one embodiment, second dielectric layer 34 has a thickness of at most 8000 Angstroms, and more preferably, has a thickness of 2000 to 6000 Angstroms.

Figure 3:
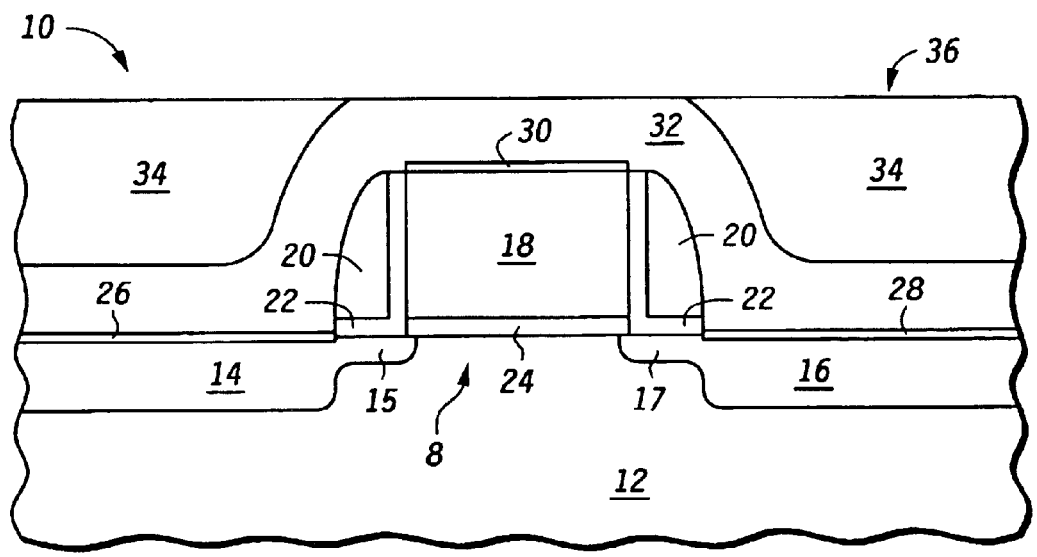
FIG. 3 illustrates a cross sectional view of the gate stack of FIG. 2 after a CMP process, in accordance with one embodiment of the present invention.

FIG. 3 illustrates semiconductor device 10 after a post gate stack CMP process. Second dielectric layer 34 is polished using CMP where first dielectric layer 32 serves as a polish stop. Therefore, as illustrated in FIG. 3, the CMP is selective to first dielectric layer 32 where the CMP of dielectric layer 34 may stop on first dielectric layer 32 or may erode a portion of first dielectric layer 32. After the CMP, a substantially planarized surface 36 of semiconductor device 10 (comprising an exposed portion of first dielectric layer 32 and an exposed portion of second dielectric layer 34) is achieved. In one embodiment, a bonded abrasive process is used to remove portions of second dielectric layer 34 and self planarize to the polish stop (first dielectric layer 32). The bonded abrasive process includes conditioning of the bonded abrasive pad (either in-situ or ex-situ) and an in-situ de-ionized (DI) water rinse where the DI water is applied to the bonded abrasive pad while applying the bonded abrasive pad to second dielectric layer 34. In one embodiment, the polish is performed for at most about 300 seconds. Alternatively, a fixed abrasive process or a high selectivity ceria slurry may be used to perform the CMP. Therefore, note that after CMP, an exposed surface (i.e. top surface) of planarized dielectric layer 34 is coplanar with an exposed surface (i.e. top surface) of first dielectric layer 32. Also, note that in one embodiment, planarized surface 36 is formed such that it is at a substantially uniform height above substrate 12.

Figure 4:
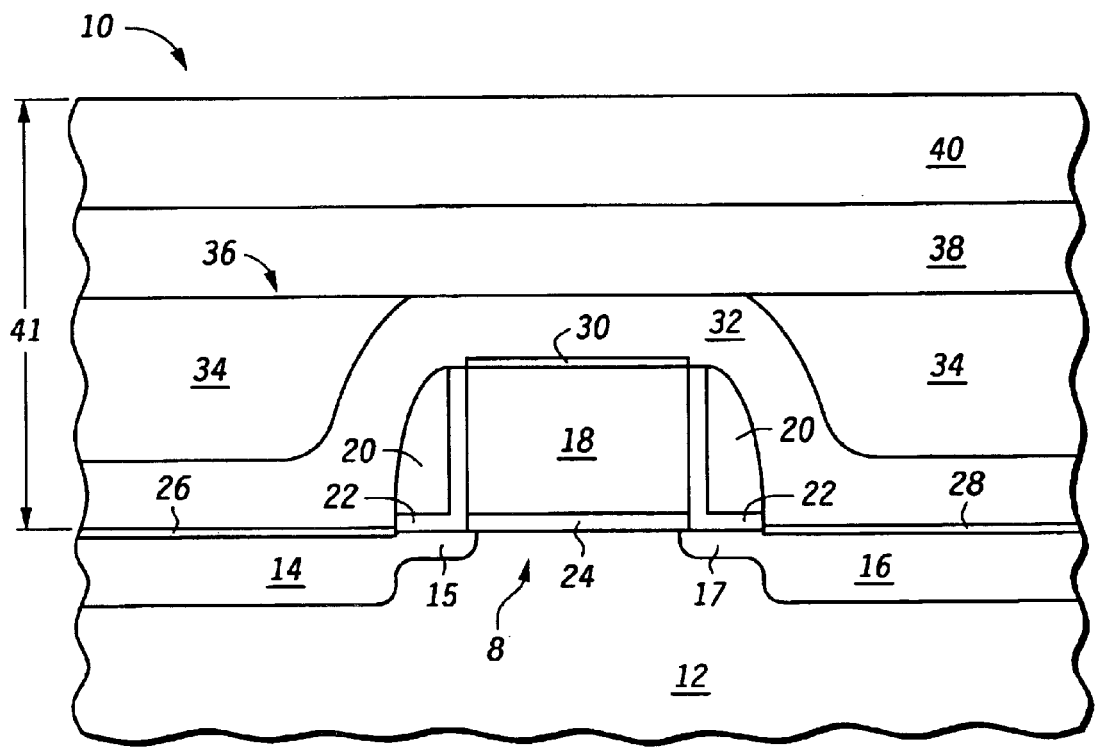
FIG. 4 illustrates a cross sectional view of the gate stack of FIG. 3 after formation of third and fourth dielectric layers overlying the gate stack and first dielectric layer, in accordance with one embodiment of the present invention.

FIG. 4 illustrates semiconductor device 10 after formation of a third dielectric layer 38 overlying planarized surface 36 (i.e. overlying planarized dielectric layers 32 and 34) and formation of a fourth dielectric layer 40 overlying dielectric layer 38. In one embodiment, third dielectric layer 38 may be a plasma deposited silicon-oxide. Alternatively, third dielectric layer 38 may be any low-K material, such as, for example, fluorinated silicon oxide, carbon doped silicon oxide, xerogel, aerogel, or a polymeric low-K material. The thickness of third dielectric layer 38 may be selected such that the resulting thickness 41 may be tuned for achieving improved contact formation and improved metal to gate capacitance, both of which will be described in more detail below. In one embodiment, third dielectric layer 38 has a thickness of 500 to 2000 Angstroms. Note that third dielectric layer 38 may also be referred to as a spacer dielectric layer.

In one embodiment, fourth dielectric layer 40 may be an anti-reflective coating (ARC) used to adequately image the contact openings (to be described below). The ARC may be formed using silicon rich nitride, silicon rich oxide, or a combination thereof. In one embodiment, a spin-on bottom ARC applied during a photo resist deposition step may also be used. However, note that in alternate embodiments, fourth dielectric layer 40 may be present for the subsequent patterning of contact openings but may not be present in the final completed device. Also, note that in some embodiments, fourth dielectric layer 40 may also act as a tungsten CMP polish stop layer used to create the contacts. (Also, note that in one embodiment, due to the resulting planarized surface 36, dielectric layers 38 and 40 are also at a substantially uniform height above substrate 12. Therefore, in one embodiment, height 41 is substantially uniform across the die and/or across the wafer.)

Figure 5:
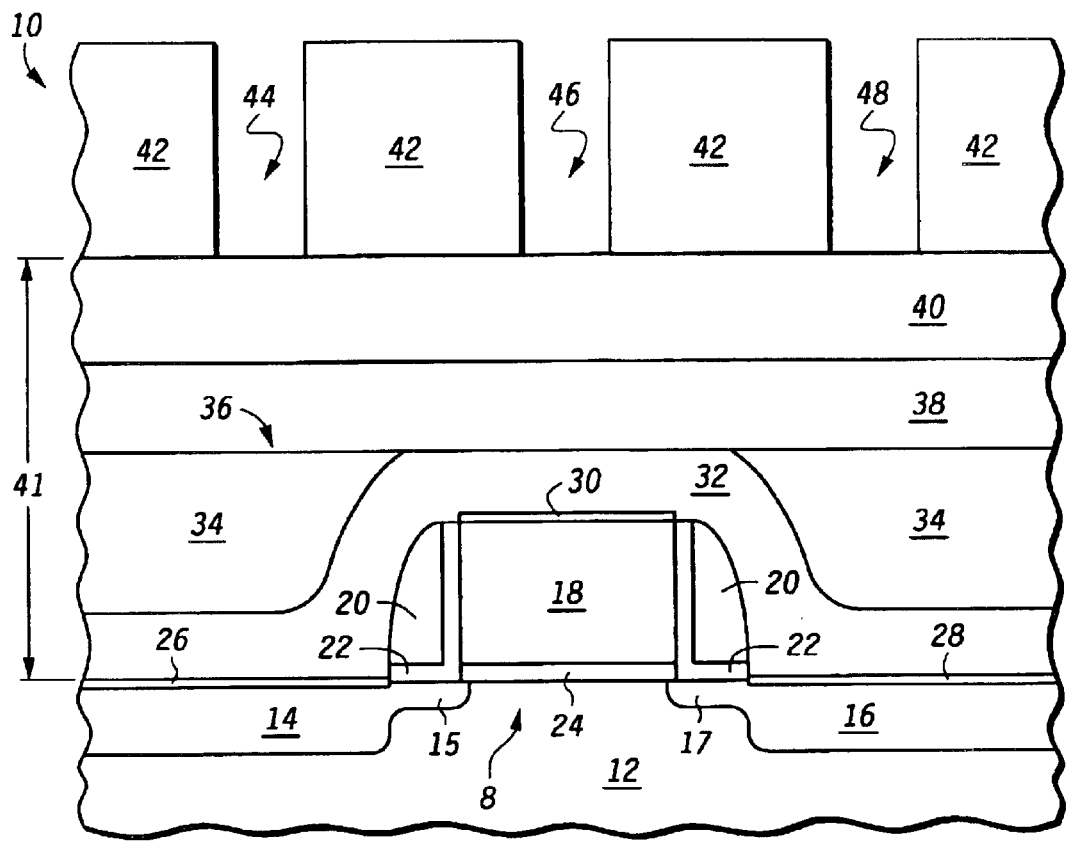
FIG. 5 illustrates a cross sectional view of the gate stack of FIG. 4 after formation of a patterned masking layer overlying the fourth dielectric layer, in accordance with one embodiment of the present invention.

FIG. 5 illustrates semiconductor device 10 after formation of a patterned masking layer 42 overlying fourth dielectric layer 40. Patterned masking layer 42 defines openings 44, 46, and 48 which will be used to form contact openings to salicided source/drain region 26, salicided gate region 30, and salicided source/drain region 28, respectively. In one embodiment, patterned masking layer is a patterned photo resist layer. Note that in one embodiment, fourth dielectric layer 40 may also act as a hard mask for forming the contact openings defined by openings 44, 46, and 48. Note that patterned masking layer may therefore be formed using conventional processing steps as known in the art.

Figure 6:
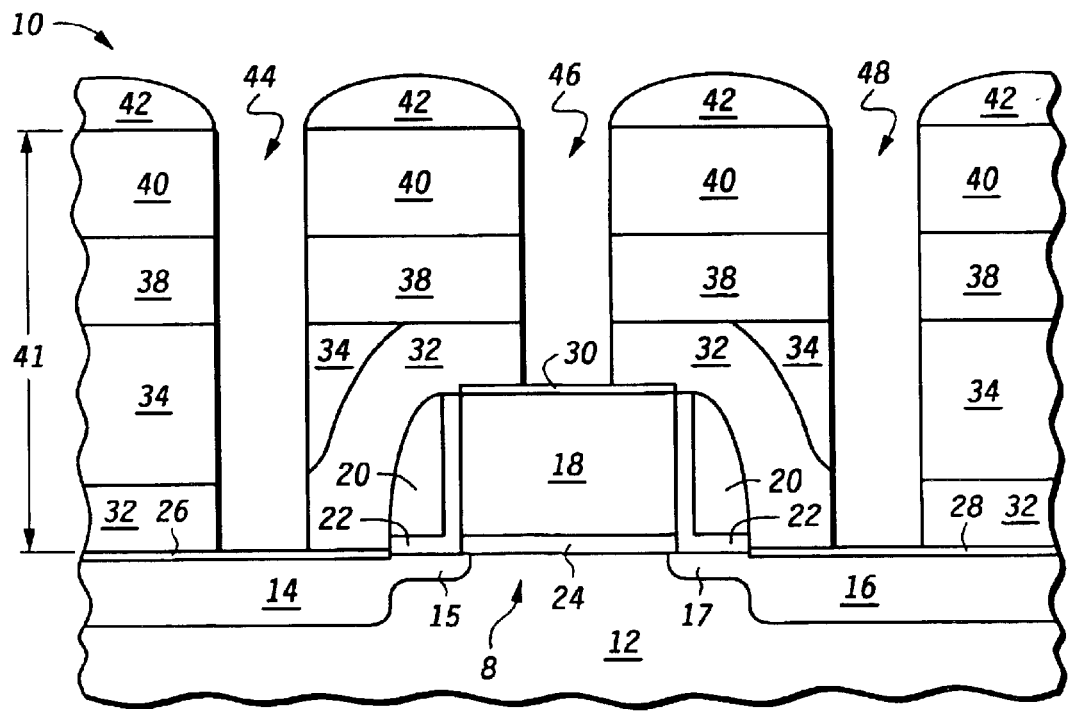
FIG. 6 illustrates a cross sectional view of the gate stack of FIG. 5 after formation of contact openings, in accordance with one embodiment of the present invention.

FIG. 6 illustrates semiconductor device 10 after etching through dielectric layers 40, 38, 34, and 32 to form contact openings or vias 44, 46, and 48 to salicided source/drain region 26, salicided gate region 30, and salicided source/drain region 28, respectively. Conventional etch processes may be used, where, for example, different etch chemistries may be used to etch through the different dielectric layers. Note that during the etch processes, portions of patterned masking layer 42 are eroded, thus resulting in the tapered, or curved, portions of masking layer 42 as illustrated in FIG. 6. Note that the planarization of dielectric layers 32 and 34 and the flexibility allowed in selecting materials and thicknesses of dielectric layers 38 and 40 permits flexibility in thickness selection for patterned masking layer 42 (of FIG. 5). Also, note that total height 41 can be reduced as compared to methods currently available today as a result of the improved planarization of dielectric layer 34 as no excess portion of dielectric layer 34 is needed between dielectric layer 32 overlying gate 18 and dielectric layer 38. Therefore, note that dielectric layer 38 may be in direct contact with a portion of dielectric layer 32 overlying gate stack 8. The reduced total height 41 also allows for a reduced thickness for patterned masking layer 42 because less etching is required. Also, note that the materials and thickness of dielectric layer 38 may be chosen so as to minimize the overlying metal (not shown in FIG. 6) to gate stack 18 interlayer capacitance.

Figure 7:
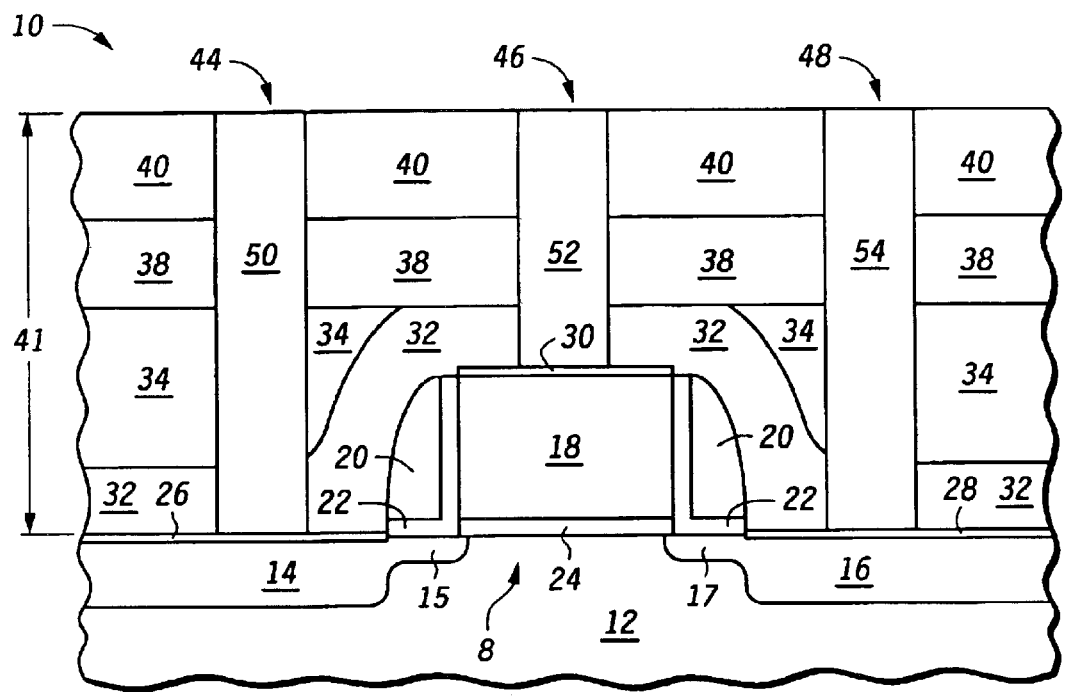
FIG. 7 illustrates a cross sectional view of the gate stack of FIG. 6 after formation of contacts, in accordance with one embodiment of the present invention.

FIG. 7 illustrates semiconductor device 10 after removal of patterned masking layer 42 and formation of contacts (or conductive vias) 50, 52, and 54 within contact openings 44, 46, and 48, respectively. Contacts 50, 52, and 54 are formed by filling openings 44, 46, and 48 with a conductive material. In one embodiment, contacts 50, 52, and 54 are formed by depositing a metal layer overlying fourth dielectric layer 40 and within openings 44, 46, 48. The metal layer may include any number of layers, such as liner layer, as known in the art. For example, in one embodiment, the metal layer may include a titanium nitride liner layer and an overlying tungsten metal layer deposited using physical vapor deposition (PVD) or chemical vapor deposition (CVD). The metal layer may then be polished using CMP so that contacts 50, 52, and 54 become isolated by exposed regions of fourth dielectric layer 40 (or if not present, of third dielectric layer 38). Note that the CMP overpolish may remove portions of fourth dielectric layer 40 (if present). Therefore, due to the ability to achieve a reduced total height 41, a reduced thickness of patterned masking layer 42 may be used while still preventing damage to the underlying dielectric layers (such as dielectric layer 40, or, if not present, dielectric layer 38) and thus, still allowing contacts 50, 52, and 54 to be properly isolated. A reduced total height 41 also allows for a reduced aspect ratio of contact openings 44, 46, and 48 which also improves the metal fill of the contact openings to form improved contacts 50, 52, and 54.

Figure 8:
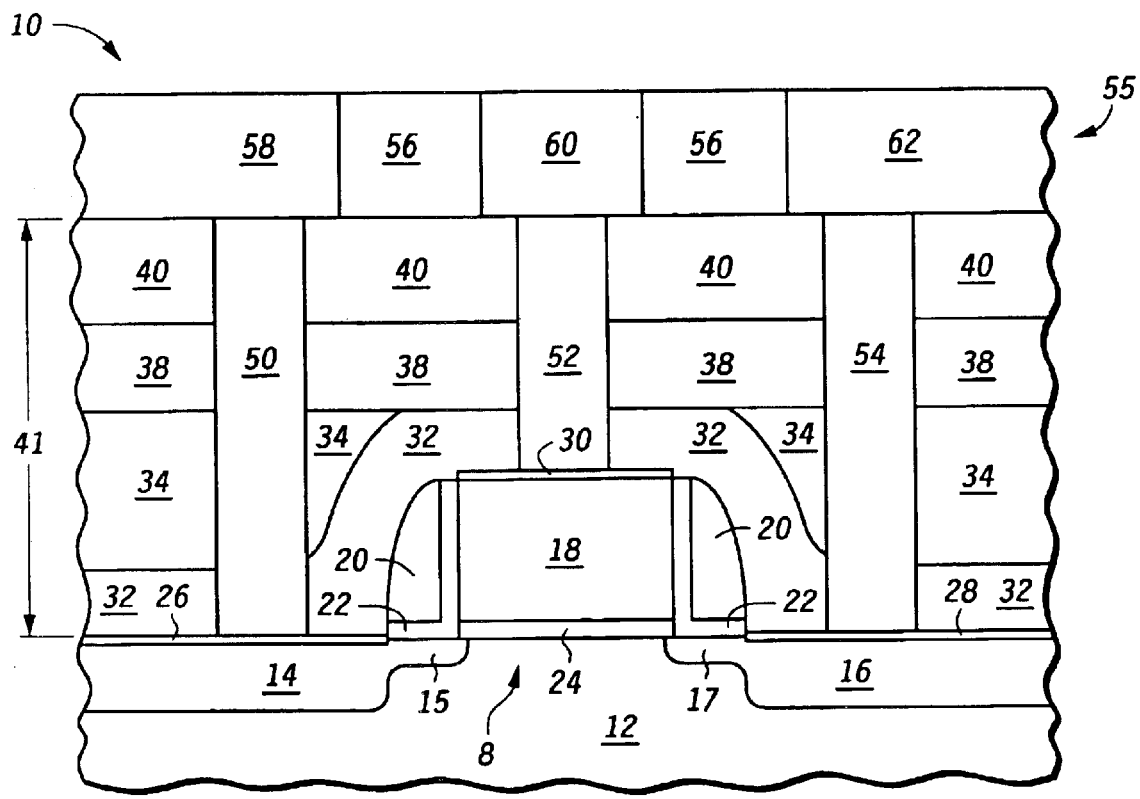
FIG. 8 illustrates a cross sectional view of the gate stack of FIG. 7 after formation of a subsequent metal layer, in accordance with one embodiment of the present invention.

FIG. 8 illustrates semiconductor device 10 after formation of a metal layer 55 overlying contacts 50, 52, and 54 and fourth dielectric layer 40. Metal layer 55 includes metal portions 58, 60, and 62, isolated by dielectric regions 56. Note that dielectric regions 56 may contain multiple layers acting as etch and polish stop as well as the bulk dielectric material. Also, note that metal portions 58, 60, and 62, may include metals such as aluminum, copper, tungsten, or the like and may also include multiple layers such as liner or barrier layers, as known in the art. Therefore, metal portions 58, 60, and 62 provide for the ability to route signals to and from contacts 50, 52, and 54. Note also that in alternate embodiments, metal portions 58, 60, and 62 may be any type of conductive material, such as conductive polymers. Note that, as mentioned above, the flexibility in the choice of thickness and materials for dielectric 38 allows for the ability to optimize the interlayer capacitance between metal layer 55 and gate 18. Also, note that contacts 50, 52, and 54 may be used to form local interconnects (not shown). Subsequent processing may then be performed, as known in the art, to form a completed semiconductor device. For example, semiconductor device 10 may include other metal layers as well as other device layers, as known in the art.

Therefore, it can be understood how the use of first dielectric layer 32 as a polish stop layer for the post gate stack CMP polishing of second dielectric layer 34 achieves improved planarization which therefore allows for improved flexibility in processing such as by providing the ability to tune such parameters as the total height 41, and the materials and thickness for third dielectric layer 38. This also allows for improved contact formation (such as reduced aspect ratios) and improved metal to gate capacitance. Also, note that openings 44 and 48 can be made to have very uniform depths which also allows for the photo resist thickness to be minimized to reduce the problems associated with small hole openings and openings that are at minimum pitches. Furthermore, the planarization of dielectric layer 34 described herein may allow for the height of gate 18 to be maintained thus providing for improved flexibility in the choice of source/drain implants used to create source/drain regions 14 and 16 without risking dopant penetration of gate stack 8 into the channel region underlying gate oxide 24.

Note also that as can be understood by one skilled in the art, the ability to reduce the contact aspect ratio (through the ability to tune total height 41) also enables the integration of a dual inlaid structure for metal and contact formation. Process steps can be reduced by using a dual inlaid structure, either via first trench last or trench first via last type integration.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a semiconductor device, comprising:

providing a substrate;

providing a gate stack over the substrate;

implanting into the substrate using the gate stack as a mask to form a source and a drain adjacent to the gate stack;

forming a first dielectric layer over the substrate and gate stack;

forming a second dielectric layer over the first dielectric layer;

polishing the second dielectric layer to the first dielectric layer over the gate stack to form a substantially planar surface comprising an exposed portion of the first dielectric layer over the gate stack and an exposed surface of the second dielectric layer;

forming a third dielectric layer over the substantially planar surface, wherein the third dielectric comprises a spacer dielectric layer on the substantially planar surface and an anti-reflective layer over the spacer dielectric layer;

etching vias in the third dielectric layer, the second dielectric layer, and the first dielectric layer over the source and the drain; and filling the vias with conductive material.

2. The method of claim 1, wherein the first dielectric comprises nitride and the second dielectric comprises oxide.

3. The method of claim 2, wherein the step of polishing comprises applying a bonded abrasive pad to the second dielectric layer.

4. The method of claim 3, wherein the step of polishing further comprises applying de-ionized water to the bonded abrasive pad while applying the bonded abrasive pad to the second dielectric layer.

5. The method of claim 4, wherein the step of polishing further comprises conditioning the pad.

6. The method of claim 5, wherein the step of polishing is for less than about 300 seconds.

7. A method for making a semiconductor device, comprising:

providing a substrate;

providing a gate stack over the substrate;

implanting into the substrate using the gate stack as a mask to form a source and a drain adjacent to the gate stack;

forming a first dielectric layer over the substrate and gate stack;

forming a second dielectric layer over the first dielectric layer;

polishing the second dielectric layer to the first dielectric layer over the gate stack to form a substantially planar surface comprising an exposed portion of the first dielectric layer over the gate stack and an exposed surface of the second dielectric layer;

forming a third dielectric layer over the substantially planar surface, wherein the third dielectric comprises a plurality of dielectric layers;

etching vias in the third dielectric layer, the second dielectric layer, and the first dielectric layer over the source and the drain; and filling the vias with conductive material.

8. The method of claim 1, wherein the spacer dielectric layer is selected from silicon oxide, xerogel, aerogel, carbon-doped silicon oxide, fluorinated silicon oxide, and polymeric low k materials.

9. The method of claim 8, wherein the anti-reflective coating comprises nitride.

10. A method for making a semiconductor device, comprising:

providing a substrate;

providing a gate stack over the substrate;

implanting into the substrate using the gate stack as a mask to form a channel under the gate stack with a source and a drain on opposite sides of the channel;

forming a first dielectric layer over the substrate and gate stack;

forming a second dielectric layer over the first dielectric layer;

polishing the second dielectric layer to have a top surface substantially coplanar with a top surface of the first dielectric layer over the gate stack, wherein the step of polishing is selective between the first and second dielectric layers;

forming a third dielectric layer over the substrate after polishing;

etching vias in the third dielectric layer, the second dielectric layer, and the first dielectric layer over the source and the drain; and filling the vias with conductive material to form conductive vias.

11. The method of claim 10, wherein the first dielectric layer is nitride and the second dielectric layer is oxide.

12. The method of claim 10, wherein the third dielectric layer comprises a spacer dielectric on the second dielectric layer and an antireflective coating over the spacer dielectric.

13. The method of claim 10, wherein the gate stack, the source, and the drain have a silicide top surface.

14. The method of claim 10, wherein the step of forming the second dielectric forms the second dielectric directly on the first dielectric.

15. The method of claim 10, wherein the step of polishing is selective between the first and second dielectric layers.

16. A method of forming a semiconductor device in a substrate, comprising:

forming a transistor in the substrate, the transistor having a gate stack over the substrate;

forming a first dielectric layer over the substrate;

forming a second dielectric layer over the first dielectric;

polishing the second dielectric until the second dielectric has a top surface coplanar with a top surface of the first dielectric over the gate stack, wherein the step of polishing is selective between the first and second dielectric layers;

forming contacts to the transistor; and forming a third dielectric layer over the substrate after the step of polishing and before the step of forming contacts.

17. The method of claim 7, wherein the first dielectric comprises nitride and the second dielectric comprises oxide.

18. The method of claim 17, wherein the step of polishing comprises applying a bonded abrasive pad to the second dielectric layer.

19. The method of claim 18, wherein the step of polishing further comprises applying de-ionized water to the bonded abrasive pad while applying the bonded abrasive pad to the second dielectric layer.

20. The method of claim 19, wherein the step of polishing further comprises conditioning the pad.

21. The method of claim 20, wherein the step of polishing is for less than about 300 seconds.

22. The method of claim 7, wherein one of the plurality of dielectric layers formed in the third dielectric layer is a spacer dielectric layer, wherein the spacer dielectric layer is selected from silicon oxide, xerogel, aerogel, carbon-doped silicon oxide, fluorinated silicon oxide, and polymeric low k materials.

23. The method of claim 11, wherein the step of polishing comprises applying a bonded abrasive pad to the second dielectric layer.

24. The method of claim 23, wherein the step of polishing further comprises applying de-ionized water to the bonded abrasive pad while applying the bonded abrasive pad to the second dielectric layer.

* * * * *